United States Patent
Chiu et al.

(12) 
(10) Patent No.: US 6,265,469 B1
(45) Date of Patent: Jul. 24, 2001

(54) EPOXY RESIN ADHESIVE FOR FLEXIBLE PRINTED CIRCUITS

(75) Inventors: Chien-Hwa Chiu; Der-Jen Sun; Ya-Fen Tsai; Chien-Yu Chen, all of Hsinchu (TW)

(73) Assignee: Du Pont Wirex Ltd, Hsinchu (TW)

( * ) Notice: Subject to any disclaimer, the term of this patent is extended or adjusted under 35 U.S.C. 154(b) by 0 days.

(21) Appl. No.: 09/388,542

(22) Filed: Sep. 2, 1999

(51) Int. Cl.[7] ................................ C08K 3/34; C08L 63/02
(52) U.S. Cl. ........................ 523/435; 523/434; 523/461
(58) Field of Search ................................ 523/461, 466, 523/434, 435

(56) References Cited

U.S. PATENT DOCUMENTS 3,966,837 * 6/1976 Riew et al. .

FOREIGN PATENT DOCUMENTS

52107090 * 9/1977 (JP) .
11171951 * 6/1999 (JP) .

OTHER PUBLICATIONS

Pritykin, et al., Plast. Massy (1981) (9), p. 36–39, 1981.*

* cited by examiner

*Primary Examiner*—Robert Dawson
*Assistant Examiner*—D. Aylward
(74) *Attorney, Agent, or Firm*—Bacon & Thomas

(57) ABSTRACT

Epoxy resin adhesive formulations are disclosed which improve the bonding strength of laminates without loss of flexibility. These epoxy resin adhesive formulations comprise one or more epoxy resins, rubber compounds, curing compounds, a hindered piperidinyloxy compound, and optionally one or more fillers.

10 Claims, No Drawings

EPOXY RESIN ADHESIVE FOR FLEXIBLE PRINTED CIRCUITS

BACKGROUND OF THE INVENTION

1. Field of the Invention

This invention relates to an epoxy resin adhesive composition. More specifically, it relates to an epoxy resin adhesive composition having excellent adhesion flexibility, heat resistance, and chemical resistance, suitable for use in the production of a flexible printed circuits.

2. Background of the Invention

Flexible printed circuits have enormous development potential for use in huge new product areas where extreme thinness, highest density and volume manufacturability are important. A typical flexible printed circuit consists of three layers of material: a dielectric layer, a conductor layer and a coverlayer. An adhesive is the bonding medium between layers for creating a laminate of flexible printed circuit. The adhesive chosen is normally carefully matched to achieve the best mix of desirable properties for the laminate. The adhesive must be able to meet the demands for the manufacturing of the lamination and the processing of the flexible printed circuit.

There are many requirements of adhesive to meet the different demands that can be placed on a flexible printed circuit, for instance, should have good thermal properties, chemical resistance, bonding strength and flexibility. In addition, the adhesive must be easily processing.

Epoxy resins have excellent characteristics in thermal properties electrical properties, mechanical strength, and chemical resistance, and good bonding to copper foil and to polyimide film. They are used as an adhesive materials for printed circuits or flexible printed circuits. However, epoxy resins have a drawback of being brittle, resulting from their excessively high density of crosslinking while the resins are cured with amines, acid anhydrides and phenol compounds. The epoxy resin used as an adhesive for the flexible printed circuits should be a flexible compound, because brittle adhesive may cause a deadly damage in any bending occurrence.

A conventional method of reducing the crosslinking density to improve toughness is by using either of the epoxy resin itself or by the curing agent being compounding in excess of one another. However, since the molecular chain is terminated by the epoxy resin or by the curing agent positioned at the molecular terminal in the curing reaction, the thermal properties and chemical properties of epoxy resin will be greatly deteriorated.

Another approach is by using a rubber modified epoxy resin composition which may give the epoxy resin toughness without reducing the crosslinking density and, furthermore, only modest reductions in thermal properties.

Compounding a rubber into the epoxy resin composition may obtain a satisfied toughness without degrading the chemical resistance and bonding properties, however, the thermal properties will be degraded. The rubber compounds may be easily oxidized and deteriorated under either a high temperature laminating process or a high temperature soldering process. Thus some antioxidant compounds can be employed into the rubber-compounding epoxy resin composition to overcome said oxidation problem. In the present invention, a hindered piperidinyloxy compound, formula I,

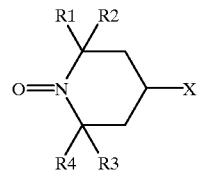

Formula I is served as anti-oxidation agent for both of epoxy resins and rubber compounds. The hindered amine compound may stabilize the epoxy resins and rubber compounds while they are under a high temperature processing. It was found in the present invention that employing small amount of the hindered amine compounds into the epoxy resin composition can dramatically improve the peel strength of laminate for flexible printed circuits.

SUMMARY OF THE INVENTION

This invention relates to epoxy resin adhesive formulations, which can improve the bonding strength of laminates without loss of flexibility. This invention also comprises one or more epoxy resins, rubber compounds, curing agents, a hindered piperidinyloxy compounds, and optionally one or more fillers.

The epoxy resin adhesive of this invention is prepared by admixing one or more brominated epoxy resins and butadiene rubber. In another embodiment the adhesive formulation will further contains a multifunctional epoxy resin, which serves to improve the heat resistance of the adhesive formulation while exposing to high temperature processing of lamination or soldering.

The epoxy resin adhesive of this invention comprising an antioxidant of hindered amine compound is served to prevent oxidation of the both of the epoxy resin compositions and the compounding butadiene rubber.

DETAILED DESCRIPTION OF THE INVENTION

This invention relates to epoxy resin adhesive formulations comprising
    (a) one or more epoxy resin;
    (b) a curing agent;
    (c) a rubber;
    (d) optionally, an inorganic filler; and
    (e) a hindered piperidinyloxy compound.
Examples of suitable epoxy resins include: bisphenol A epoxy resin, bisphenol F epoxy resin, brominated bisphenol A epoxy resin, brominated bisphenol F epoxy resin, fluorinated bisphenol A epoxy resin, fluorinated bisphenol F epoxy resin, cresol novolac epoxy resin and phenol novolac epoxy resin. In the present invention epoxy resins may be used either alone or in combination.

To improve the flame retardance of adhesive, the preferred epoxy resin is selected from brominated epoxy resins. The preferred amount of brominated epoxy resin is comprising at least 55 parts by weight based on 100 parts by weight of epoxy resin. To improve the thermal properties or chemical resistance of the adhesive, the preferred epoxy resins further comprised multifunctional epoxy resins. The preferred amount of multifunctional epoxy resin is comprising 1 to 45 parts by weight based on 100 parts by weight of epoxy resin. Examples of multifunctional epoxy resin include cresol novolac epoxy resin, phenol novolac epoxy resin and epoxy resin consisted of a tetrakis-glycidyl-4-phenyloethane, formula II

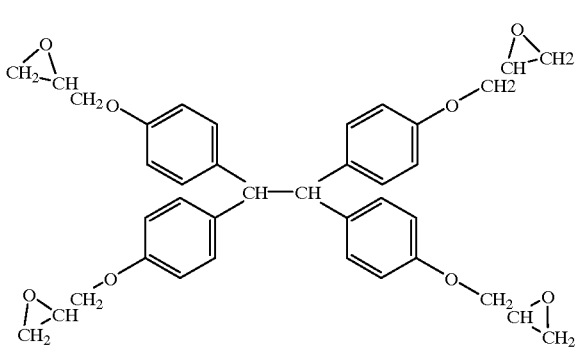

Formula II

Examples of suitable curing agents include:
3,3'-diaminodiphenyl sulfone(3,3'-DDS), 4,4'diaminodiphenyl sulfone(4,4'-DDS), methylene dianiline(DDM), 4,4'-oxydianiline(ODA), m-phenylene diamine(MPD), tetra-methyl-di(4-aminophenyl)-diisopropyl benzene and dicyandiamide(DICY).

Examples of suitable curing catalysts include:
2-methyl-imidazole (2MI/2MZ), 2-ethyl-4-methyl-imidazole (2E4MI/2E4MZ), 2-phenyl-imidazole (2PI/2PZ), dimethylaminomethyl phenol, tris (dimethylaminomethyl) phenol, benzyldimethylamine (BDMA), diazabicycloundecene(DBU) and dicyandiamide(DICY). The preferred curing catalyst is an imidazole catalyst.

Examples of suitable rubber include:
carboxyl-terminated butadiene acrylonitrile (CTBN), styrene-butadiene rubber(SBR), amine terminated butadiene acrylonitrile (ATBN) and silicon rubber.

There are many types of elastomeric materials may be considered for the toughness modification of epoxy resins, the preferred rubber in the present invention is butadiene-acrylonitrile. Increasing the content of rubber in the epoxy resin composition results in an increase the fraction of elastomeric phase, however, too much rubber contained may deteriorate the mechanical properties of epoxy resin. The preferred amount of rubber is 10 to 200 parts by weight based on 100 parts by weight of epoxy resin.

Inorganic fillers allow the possibility to modify various characteristics of epoxy resin including thermal conductivity, thermal expansion coefficient and dimensional stability. The filler employed also influence the processing behavior of the epoxy resin. However, the type and amount of the filler in the present invention may depended on the processing and final application of the epoxy resin adhesive.

Examples of suitable inorganic fillers include:
silica, mica, aluminum oxide, aluminum hydroxide, titanium oxide talc, magnesium hydroxide, zinc carbonate and antimony trioxide.

The hindered piperidinyloxy compound, more preferable is a tetraalkyl piperidinyloxy, represent as formula I, was used in present invention in order to improve the heat resistance of epoxy resin composition. Wherein $R_1, R_2, R_3$ and $R_4$, which may be the same or different are selected from hydrogen or a $C_{1-3}$ alkyl group, and X is selected from hydrogen, hydroxyl, an alkyl group, a hydroxyalkyl group or a hydroxyaryl group. An example of the hindered piperidinyloxy compounds used in the present invention is 2,2,6,6-tetramethyl-4-hydroxypiperidyloxide (TMHPO) and non-limiting examples of these hindered piperidinyloxy compounds of the present invention include:

2,2,6,6-tetraethyl-4-hydroxypiperidyloxide
2,2,6,6-tetrapropyl-4-hydroxypiperidyloxide
2,2,6,6-tetramethyl-4-methylpiperidyloxide
2,2,6,6-tetraethyl-4-methylpiperidyloxide
2.2,6,6-tetrapropyl-4-methylpiperidyloxide
2,2,6,6-tetramethyl-4-methoxypiperidyloxide
2,2,6,6-tetraethyl-4-methoxypiperidyloxide
2,2,6,6-tetrapropyl-4-methoxypiperidyloxide
2,2,6,6-tetramethyl-4-phenoxypiperidyloxide
2,2,6,6-tetraethyl-4-phenoxypiperidyloxide
2,2,6,6-tetrapropyl-4-phenoxypiperidyloxide

EXAMPLES

This invention is further described in detail below with reference to Examples and Comparative Examples, but it is not limited thereto. In these examples, all "parts" are "parts by weight" unless specified otherwise; "phr" is parts per hundred resin.

As used herein, the composition of epoxy resin contained two brominated epoxy resins and one phenol novolac epoxy resin and/or one tetrafunctionalal epoxy resin. The brominated epoxy resins are BEB-521A-70 and BEB-400T-60. Where BEB-521A-70 contains 20–22% of bromine and equivalent value of 450–500 (wpe). BEB-400T-60 contains 46–50% of bromine and equivalent value of 380–420 (wpe). The phenol novolac epoxy resin, PNE-177, which possesses an equivalent value of 172–182.

In these examples, the preferred tetrafunctional epoxy resin is tetrakis-glycidyl-4-phenyloethane, formula II.

In these examples, the preferred hindered piperidinyloxy compounds is 2,2,6,6-tetramethyl-4-hydroxypiperidinyloxy (TMHPO).

Example 1 Through 3

There are three examples in this invention the epoxy resin adhesive compositions comprising an anti-oxidant of hindered piperidinyloxy compound. These examples illustrate different epoxy resin compositions were employed a small amount of TMHPO, one of preferred hindered piperidinyloxy compounds in this invention, showed an improvement of bonding strength of the epoxy resin adhesive.

Example 1

An epoxy resin adhesive formulation was prepared by admixing 23 parts of BEB-521A-70, 77 parts of BEB-400T-60, 82 parts of CTBN, 20 phr of DDS, 1.5 phr of 2MZ, 42 parts of Al(OH) and 0.2 phr of TMHPO with methyl ethyl ketone(MEK) solvent in a plastic container. The mixture of epoxy resin adhesive formulation was then subjected to high shear mixing in a troll mill. The epoxy resin adhesive was removed from the plastic container to a coating apparatus after all compounds were mixed together thoroughly.

Immediately thereafter, the mixed adhesive was coated onto a polyimide film, 30 to 35 micrometer in coating thickness, and then the coating was baked at 110° C. for 10 min. The epoxy resin adhesive coated polyimide film was laminated to a copper foil surface and the laminate was then cured by hot-pressing at 170° C. -30 Kg/cm² for 30 min.

The specimens for peel strength measurement were prepared by cutting from the hot-pressed laminates to form a 15 mm wide by 200 mm long and then removed 5 mm wide of copper foil from both side of each specimen. The specimens were tested in accordance with IPC-2.4.9 at 50.8 mm/min. Furthermore, the peel strength after soldering treatment was obtained by additional testing specimens which were followed 3 cycles of heating in soldering pot at 250° C. for 10 second and were tested in accordance with IPC-2.4.9.

Example 2

An epoxy resin adhesive formulation was prepared by admixing 23 parts of BEB-521A-70, 67 parts of BEB-400T-60, 15 parts of PNE-177, 82 parts of CTBN. 20 phr of DDS, 1.5 phr of 2MZ, 42 parts of Al(OH)$_3$ and 0.2 phr of TMHPO with methyl ethyl ketone(MEK) solvent in a plastic container. The mixture of epoxy resin adhesive formulation was then subjected to high shear mixing in a three-roll mill. The epoxy resin adhesive was removed from the plastic container to a coating apparatus after all compounds were mixed together thoroughly.

The procedure for preparation of copper clad laminate and measurement of peel strength of Example 1 was repeated. Additional phenol novolac epoxy resin PNE-177, will enhance the thermal properties of the epoxy resin adhesive.

Example 3

An epoxy resin adhesive formulation was prepared by admixing 23 parts of BEB-521A-70, 67 parts of BEB-400T-60, 10 parts of tetra-functional epoxy resin, formula II, 82 parts of CTBN, 20 phr of DDS, 1.5 phr of 2MZ, 42 parts of Al(OH)$_3$ and 0.2 phr of TMHPO with methyl ethyl ketone(MEK) solvent in a plastic container. The mixture of epoxy resin adhesive formulation was then subjected to high shear mixing in a three-roll mill. The epoxy resin adhesive was removed from the plastic container to a coating apparatus after all compounds were mixed together thoroughly.

The procedure for preparation of copper clad laminate and measurement of peel strength of Example 1 was repeated. Additional tetra-functional epoxy resin will increase the crosslinking density of epoxy resin and enhance the thermal resistance, chemical resistance and dimensional stability.

Comparative Example 1 Through 3(Without TMHPO)

For comparison sake, comparative examples were prepared by repeating the examples 1 through 3 without any hindered piperidinyloxy compound. The peel strength of copper clad laminate was measured with as laminated and after soldering heat treatment.

Comparative Example 1

An epoxy resin adhesive formulation was prepared by admixing 23 parts of BEB-521A-70, 77 parts of BEB-400T-60, 82 parts of CTBN, 20 phr of DDS, 1.5 phr of 2MZ and 42 parts of Al(OH)$_3$ with methyl ethyl ketone(MEK) solvent in a plastic container. The mixture of epoxy resin adhesive formulation was then subjected to high shear mixing in a three-roll mill. The epoxy resin adhesive was removed from the plastic container to a coating apparatus after all compounds were mixed together thoroughly.

The procedure for preparation of copper clad laminate and measurement of peel strength of Example 1 was repeated.

Comparative Example 2

An epoxy resin adhesive formulation was prepared by admixing 23 parts of BEB-521A-70, 62 parts of BEB-400T-60, 15 parts of PNE-177, 82 parts of CTBN, 20 phr of DDS. 1.5 phr of 2MZ and 42 parts of Al(OH)$_3$ with methyl ethyl ketone(MEK) solvent in a plastic container. The mixture of epoxy resin adhesive formulation was then subjected to high shear mixing in a three-roll mill. The epoxy resin adhesive was removed from the plastic container to a coating apparatus after all compounds were mixed together thoroughly.

The procedure for preparation of copper clad laminate and measurement of peel strength of Example 1 was repeated.

Comparative Example 3

An epoxy resin adhesive formulation was prepared by admixing 23 parts of BEB-521A-70, 67 parts of BEB-400T-60, 10 parts of tetra-functional epoxy resin, formula II, 82 parts of CTBN, 20 phr of DDS, 1.5 phr of 2MZ and 42 parts of Al(OH)$_3$ with methyl ethyl ketone(MEK) solvent in a plastic container. The mixture of epoxy resin adhesive formulation was then subjected to high shear mixing in a three-roll mill. The epoxy resin adhesive was removed from the plastic container to a coating apparatus after all compounds were mixed together thoroughly.

The procedure for preparation of copper clad laminate and measurement of peel strength of Example 1 was repeated.

The peel strength results according to the Comparative Examples fell in the range of about 1.82 to 1.97 kgf/cm$^2$ as laminated, and about 1.58 to 1.76 kgf/cm$^2$ after soldering treatment. The epoxy resin adhesive formulation without TMHPO addition shown a inferior bonding strength to laminate copper foil and polyimde film. In comparison, the peel strength results according to the Examples 1 through 3, which adhesive formulation comprising a TMHPO, fell in the range of about 2.41 to 2.64 kgf/cm$^2$ as laminated, and about 3.12 to 3.68 kgf/cm$^2$ after soldering treatment. The TMHPO can improve the bonding strength of epoxy resin adhesive with different epoxy resin compositions and with both of as laminated and after soldering treated copper clad laminate.

The composition and peel strength measured result of various formulations are tabulated below:

TABLE I

|  | Example 1 | Example 2 | Example 3 | Comparative Example 1 | Comparative Example 2 | Comparative Example 3 |
| --- | --- | --- | --- | --- | --- | --- |
| BEB-521A-70 | 23 | 23 | 23 | 23 | 23 | 23 |
| BEB-400T-60 | 77 | 62 | 67 | 77 | 62 | 67 |
| PNE-177 | — | 15 | — | — | 15 | — |
| Tetra-functional epoxy | — | — | 10 | — | — | 10 |
| CTBN | 82 | 82 | 82 | 82 | 82 | 82 |
| DDS, (phr) | 20 | 20 | 20 | 20 | 20 | 20 |
| 2MZ, (phr) | 1.5 | 1.5 | 1.5 | 1.5 | 1.5 | 1.5 |
| Al(OH)$_3$ | 42 | 42 | 42 | 42 | 42 | 42 |
| TMHPO, (phr) | 0.2 | 0.2 | 0.2 | — | — | — |

TABLE I-continued

| | Example 1 | Example 2 | Example 3 | Comparative Example 1 | Comparative Example 2 | Comparative Example 3 |
|---|---|---|---|---|---|---|
| Peel Strength (as) kgf/cm | 2.62 | 2.41 | 2.64 | 1.92 | 1.82 | 1.97 |
| Peel Strength (sn) kgf/cm | 3.42 | 3.68 | 3.12 | 1.58 | 1.76 | 1.68 |

Example 4 Through 7

As shown at table I, the bonding strength of copper clad laminate can be improved dramatically by modified the epoxy resin adhesive with a small amount of hindered piperidinyloxy compound. However, too much amount of hindered piperidinyloxy compound addition will be not improved the epoxy resin adhesive performance but caused degradation of thermal properties of epoxy resin adhesive. Examples 4 through 7 illustrate the effects of improvement of bonding strength with various amount of hindered piperidinyloxy compound addition. The Examples 4 through 7 were prepared by using the same compositions and repeating the same manner as Example I except the quantities of TMHPO.

Example 4

Example 1 was repeated except that the content of TMHPO was 0.5 parts per hundred resin (phr.)

Example 5

Example 1 was repeated except tat the content of TMHPO was 1 parts per hundred resin (phr.)

Example 6

Example 1 was repeated except that the content of TMHPO was 5 parts per hundred resin (phr.)

Example 7

Example 1 was repeated except that the content of TMHPO was 10 parts per hundred resin (phr.)

The data in Table II shown epoxy resin adhesive formulations containing 5 phr or less of TMHPO can improve the bonding strength of copper clad laminates. Whereas too much of the content of TMHPO, 10.0 phr in Example 7, in the epoxy resin adhesive formulation never improve the peel strength of laminate. The adhesive composition with higher amount of TMHPO was employed didn't show a good bonding property, because too much of the small molecular weight of TMHPO compound dispersed in the epoxy resin matrix may be degraded the mechanical properties of epoxy resins. The preferred amount of TMHPO in the present invention is present in an amount not excess 10 phr.

The results are tabulated below:

TABLE II

| | example 1 | example 4 | example 5 | example 6 | example 7 |
|---|---|---|---|---|---|
| TMHPO (phr) | 0.2 | 0.5 | 1.0 | 5.0 | 10.0 |
| Peel Strength (as) kgf/cm | 2.62 | 2.37 | 2.46 | 2.44 | 0.93 |
| Peel Strength (sn) kgf/cm | 3.42 | 2.13 | 2.19 | 2.05 | 0.82 |

We claim:
1. An epoxy resin adhesive comprising;
   (a) one or more epoxy resins;
   (b) a curing agent;
   (c) 10 to 200 parts by weight based on 100 parts by weight of epoxy resin (a) of at least one compound selected from the group consisting of carboxyl-terminated butadiene acrylonitrile (CTBN), styrene-butadiene rubber (SBR), amine terminated butadiene acrylonitrile (ATBN) and silicon rubber;
   (d) optionally, an inorganic filler; and
   (e) a hindered piperidinyloxy compound of formula I,

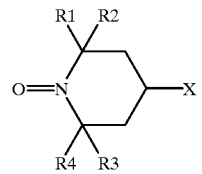

Formula I in which: $R_1$, $R_2$, $R_3$ and $R_4$, which may be the same or different, are selected from the group consisting of hydrogen and a $C_{1-3}$ alkyl group; and X is selected from the group consisting of hydrogen, hydroxyl, an alkyl group, a hydroxyalkyl group and a hydroxyaryl group.

2. An epoxy resin adhesive according to claim 1, wherein said epoxy resin comprising at least one epoxy resin selected from the group consisting of brominated bisphenol A resin or bisphenol F resin.

3. An epoxy resin adhesive according to claim 1, wherein said epoxy resin comprising at least 55 parts by weight based on 100 parts by weight of epoxy resin (a) of brominated bisphenol A resin.

4. An epoxy resin adhesive according to claim 1, wherein said epoxy resin comprising 1 to 45 parts by weight based on 100 parts by weight of epoxy resin (a) of multifunctional epoxy resin.

5. An epoxy resin adhesive according to claim 1, wherein said curing agent is selected from diaminodiphenyl sulfone (DDS), methylene dianiline(DDM), 4,4'-oxydianiline (ODA), m-phenylene diamine(MPD) and dicyandiamide (DICY).

6. An epoxy resin adhesive according to claim 1, further comprising one or more imidazoles curing catalyst.

7. An epoxy resin adhesive according to claim 4, wherein said multifunctional epoxy resin is a epoxy resin consisted of tetrakis-glycidyl-4-phenylolethane, formula II, Formula II

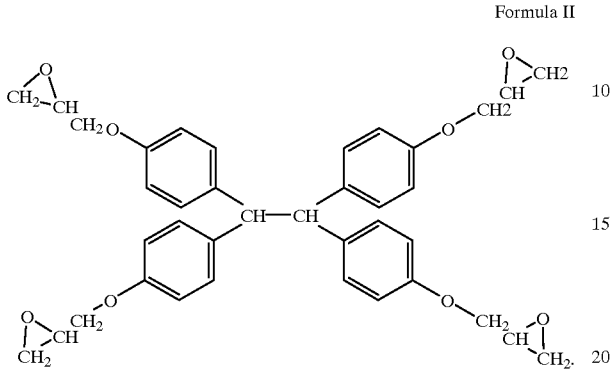

8. An epoxy resin adhesive according to claim 4, wherein said multifunctional epoxy resin is cresol novolac epoxy resin or phenol novolac epoxy resin.

9. An epoxy resin adhesive according to claim 1, wherein said hindered piperidinyloxy compound is present in an amount of not excess 10 parts per hundred resin.

10. An epoxy resin adhesive according to claim 1, wherein said hindered piperidinyloxy compound is 2,2,6,6-tetramethyl-4-hydroxypiperidinyloxy.

* * * * *